(12) United States Patent
Liu et al.

(10) Patent No.: US 6,232,175 B1
(45) Date of Patent: May 15, 2001

(54) METHOD OF MANUFACTURING DOUBLE-RECESS CROWN-SHAPED DRAM CAPACITOR

(75) Inventors: Yuan-Hung Liu; Bor-Wen Chan, both of Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/466,044

(22) Filed: Dec. 17, 1999

(30) Foreign Application Priority Data

Oct. 8, 1999 (TW) .............................................. 088117379

(51) Int. Cl.⁷ .............................................. H01L 21/8242
(52) U.S. Cl. .......................................... 438/253; 438/381
(58) Field of Search .................................... 438/253–256, 438/238, 381, 393–399

(56) References Cited

U.S. PATENT DOCUMENTS 5,474,951 * 12/1995 Han et al. .
5,668,039 * 9/1997 Lin .

* cited by examiner

*Primary Examiner*—Jey Tsai
(74) *Attorney, Agent, or Firm*—Jiawei Huang; J.C. Patents

(57) ABSTRACT

A double recess crown-shaped DRAM capacitor is formed in a simplified process. A dielectric layer is formed over a substrate. Using photolithographic and etching techniques, a contact opening is formed in the dielectric layer. A conductive layer is formed over the dielectric layer filling the contact opening to form a conductive plug. A second dielectric layer is formed over the conductive layer. Again using photolithographic and etching techniques, the second dielectric layer is patterned to form a trapezoidal-shaped dielectric layer. An organic bottom anti-reflective coating (organic BARC) is coated over the trapezoidal-shaped dielectric layer and the conductive layer. Organic BARC above the trapezoidal-shaped dielectric layer is removed. Using the organic BARC as an etching mask, the trapezoidal-shaped dielectric layer is etched to form triangular-shaped dielectric layers and a trench in the conductive layer. The residual organic BARC is completely removed. Using the triangular-shaped dielectric layers as a hard etching mask, two types of trenches each having a different depth are formed in the conductive layer. The triangular-shaped dielectric layers are removed to form a double-recess lower electrode. Hemispherical silicon grains are grown over the interior surface of the double-recess lower electrode as well as the external sidewalls. Finally, a conformal dielectric layer and a conformal conductive layer are sequentially formed over the surface of the double-recess lower electrode.

8 Claims, 3 Drawing Sheets

METHOD OF MANUFACTURING DOUBLE-RECESS CROWN-SHAPED DRAM CAPACITOR

CROSS-REFERENCE TO RELATED APPLICATION

This application claims the priority benefit of Taiwan application serial no. 88117379, filed Oct. 8, 1999.

BACKGROUND OF THE INVENTION

1. Field of the Invention

The present invention relates to a method of manufacturing dynamic random access memory (DRAM). More particularly, the present invention relates to a method of manufacturing the double recess crown-shaped capacitor of a DRAM unit.

2. Description of the Related Art

A capacitor is the 'heart' of each dynamic random access memory (DRAM) unit. Data in each DRAM unit is stored as charges inside the capacitor. Hence, the larger the capacity for storing electric charges inside a capacitor, the smaller will be the number of soft errors resulting from external interference such as impinging alpha particles. In addition, a capacitor with a large charge storage capacity can lower the refreshing frequency.

Since the capacitance of a capacitor depends on the surface area of the device, how to maintain sufficient capacitance for conducting normal functions when semiconductor device line width is smaller than 0.25 µm has become a major problem. One method of increasing the capacitance of a capacitor is to increase its surface area. For a double-recess crown-shaped capacitor, the method of increasing capacitance is to grow a hemispherical silicon grain (HSG) layer on its interior surfaces. Capacitance is increased due to the extra surface provided by the HSG layer.

In general, a double-recess crown-shaped capacitor is formed by first etching a double-recess crown-shaped trench in a silicon oxide layer. A doped polysilicon layer conformal to the surface profile is next formed over the interior surface of the trench and the silicon oxide layer. Hemispherical silicon grain (HSG) is grown on the surface of the doped polysilicon layer. Photoresist is deposited into the trench and over the doped polysilicon layer so that the hemispherical silicon grains on the doped polysilicon layer are protected by a photoresist layer. The photoresist and doped polysilicon to above the silicon oxide layer are remove by etching or chemical-mechanical polishing (CMP) so that neighboring capacitors are isolated. Finally, the photoresist layer and the silicon oxide layer are sequentially removed to form the lower electrode of the double-recess crown-shaped capacitor.

In the aforementioned method of forming the double recess crown-shaped capacitor, the photoresist layer and the silicon oxide layer must be removed using two different processes, thereby increasing processing complexity. Furthermore, if chemical-mechanical polishing is carried out to form the necessary isolation between different capacitors, special equipment must be installed because worn off photoresist particles may adhere to the polishing pad of the chemical-mechanical polishing station, thereby affecting the polishing action.

SUMMARY OF THE INVENTION

The present invention provides a method for forming a double-recess crown-shaped DRAM capacitor with simple processing steps.

To achieve these and other advantages and in accordance with the purpose of the invention, as embodied and broadly described herein, the invention provides a method for forming a double recess crown-shaped DRAM capacitor. A dielectric layer is formed over a substrate. Using photolithographic and etching techniques, a contact opening is formed in the dielectric layer. A conductive layer is formed over the dielectric layer filling the contact opening to form a conductive plug. A second dielectric layer is formed over the conductive layer. Again using photolithographic and etching techniques, the second dielectric layer is patterned to form a trapezoidal-shaped dielectric layer. An organic bottom anti-reflective coating (organic BARC) is coated over the trapezoidal-shaped dielectric layer and the conductive layer. Organic BARC above the trapezoidal-shaped dielectric layer is removed. Using the organic BARC as an etching mask, the trapezoidal-shaped dielectric layer is etched to form triangular-shaped dielectric layers and a trench in the conductive layer. The residual organic BARC is completely removed. Using the triangular-shaped dielectric layers as a hard etching mask, two types of trenches each having a different depth are formed in the conductive layer. The triangular-shaped dielectric layers are removed to form a double-recess lower electrode. Hemispherical silicon grains are grown over the interior surface of the double-recess lower electrode as well as the external sidewalls. Finally, a conformal dielectric layer and a conformal conductive layer are sequentially formed over the surface of the double-recess lower electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
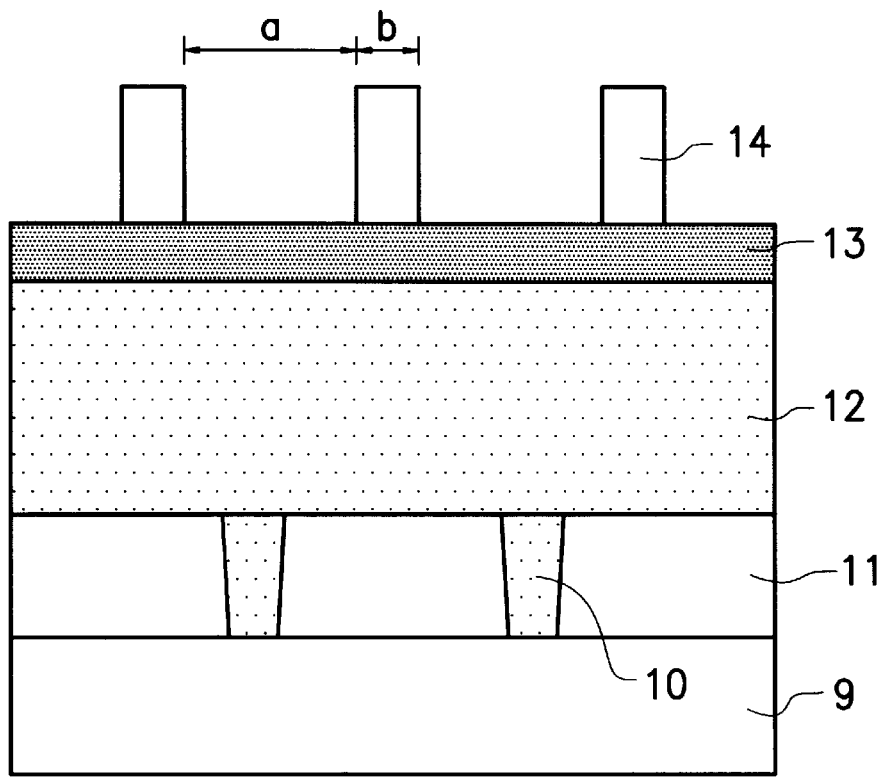
FIGS. 1A through 1F are schematic cross-sectional views showing the progression of steps for forming the lower electrode of a double-recess crown-shaped DRAM capacitor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the progression of steps for forming the lower electrode of a double-recess crown-shaped DRAM capacitor according to one preferred embodiment of this invention.

As shown in FIG. 1A, a dielectric layer 11 is formed over a substrate 9. The dielectric layer 11 can be a silicon oxide layer formed by, for example, chemical vapor deposition (CVD).

Using photolithographic and etching techniques, the dielectric layer 11 is patterned to form a contact opening. Conductive material is deposited into the contact opening and over the dielectric layer 11 to form a conductive layer 12 and a conductive plug 10. The conductive material can be doped polysilicon formed by, for example, chemical vapor deposition (CVD).

A second dielectric layer 13 is formed over the conductive layer 12. The second dielectric layer 13 can be a silicon oxide layer formed by, for example, chemical vapor deposition (CVD). A layer of photoresist (not shown in the figure) is deposited over the second dielectric layer 13. After the photoresist material is exposed to light and developed, a patterned photoresist layer 14 is formed. The photoresist layer 14 has a line width of b and a line separation of about a, wherein the line width and line separation both depend on processing requirement.

Figure 1B:
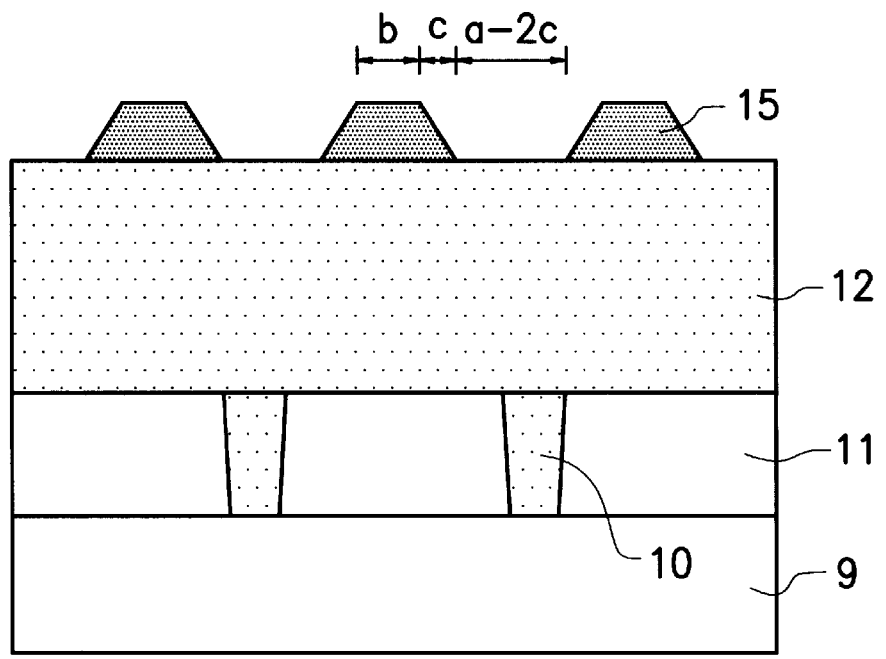

As shown in FIG. 1B, a portion of the second dielectric layer 13 is removed to form a patterned dielectric layer 15. The patterned dielectric layer 15 has a trapezoidal cross-section profile. The top of the trapezoid has a width b, the base of the trapezoid has a width b+2c and the distance of separation between neighboring trapezoids is a–2c. The magnitude of c also depends on processing requirement. The photoresist layer 14 is next removed.

Figure 1C:
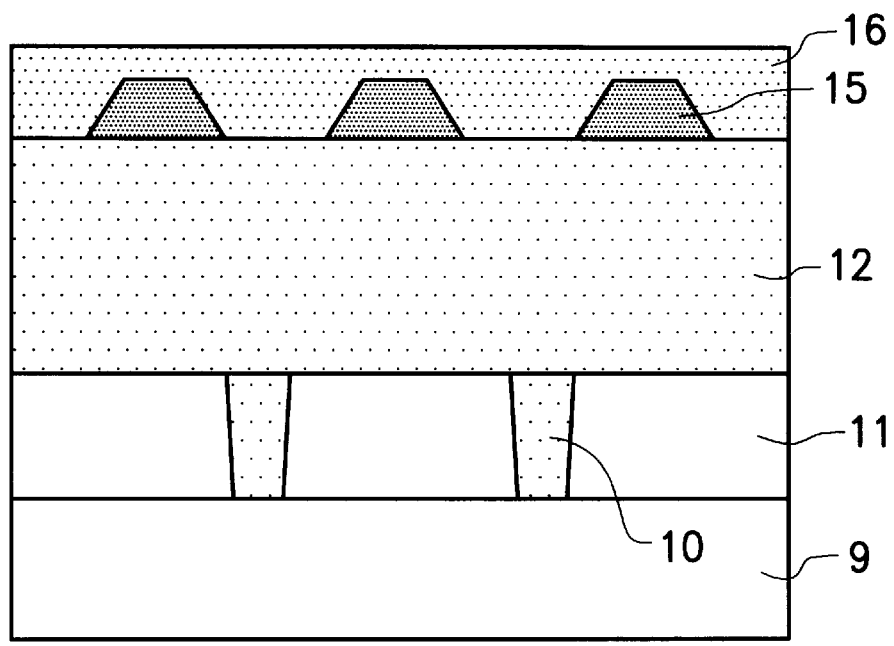

As shown in FIG. 1C, a coating layer 16 is formed over the dielectric layer 15 and the conductive layer 12. The coating layer 16 can be an organic bottom anti-reflective coating (organic BARC) formed by, for example, spin coating.

Figure 1D:
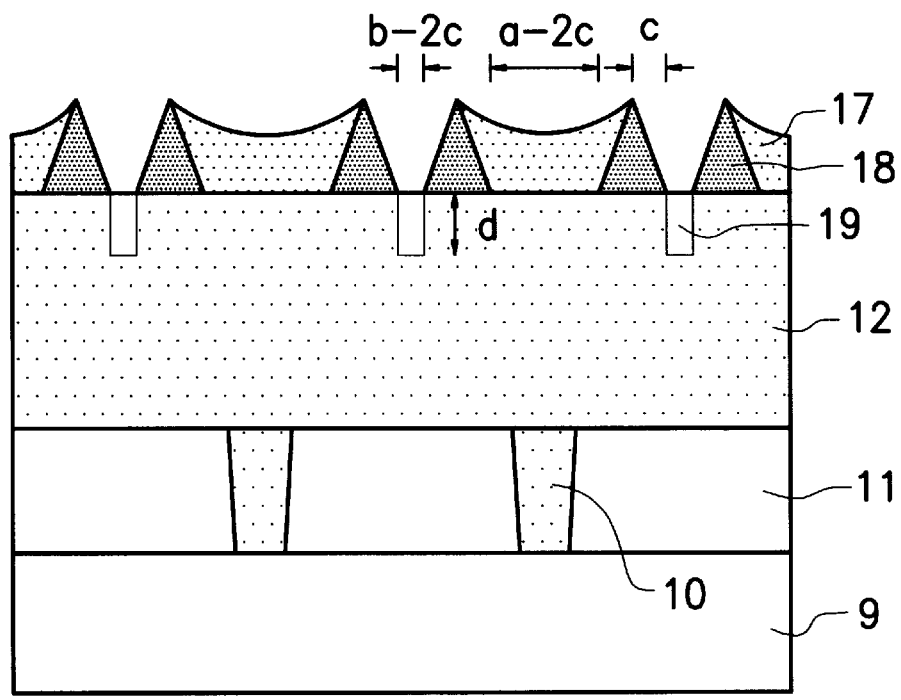

As shown in FIG. 1D, using the dielectric layer 15 as an etching stop layer, the coating layer 16 above the dielectric layer is removed to form a coating layer 17. Using the coating layer 17 as an etching mask, a portion of the dielectric layer 15 and the conductive layer 12 as shown in FIG. 1C is removed to form a trench 19 in the conductive layer 12. Ultimately, the dielectric layer 15 is transformed into another patterned dielectric layer 18. The cross-sectional profile of the patterned dielectric layer 18 is an isosceles triangular with a base width of 2c. The distances of separation of the triangles are a–2c and b–2c, respectively. The trench 19 has a width of about b–2c and depth of about d, for example. Depth d must be smaller than the thickness of the conductive layer 12 in addition to its dependency upon the processing requirement.

Figure 1E:
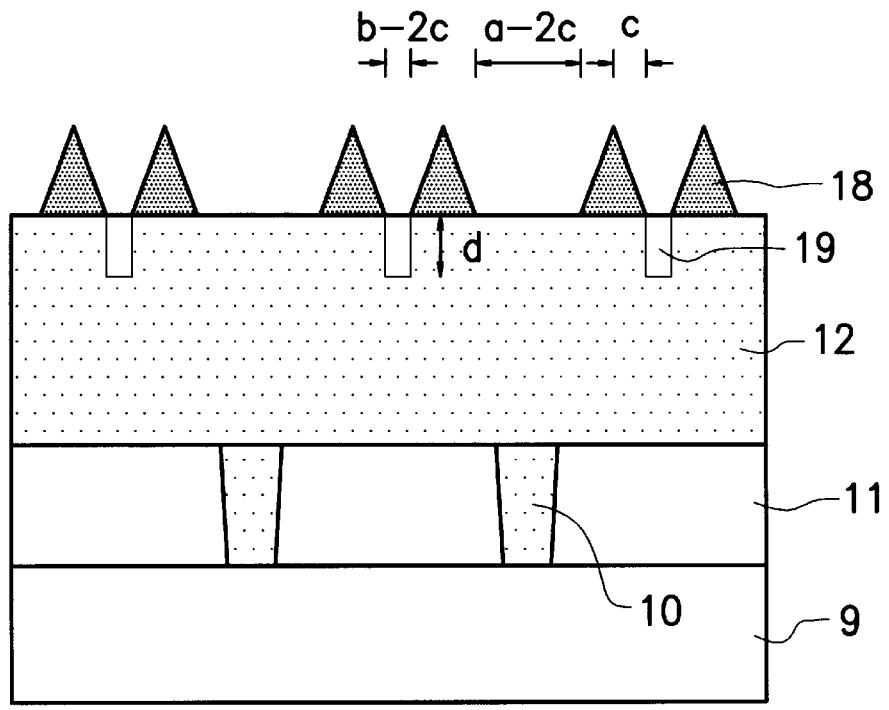

As shown in FIG. 1E, carbonization is carried out and then the coating layer 17 is removed.

Figure 1F:
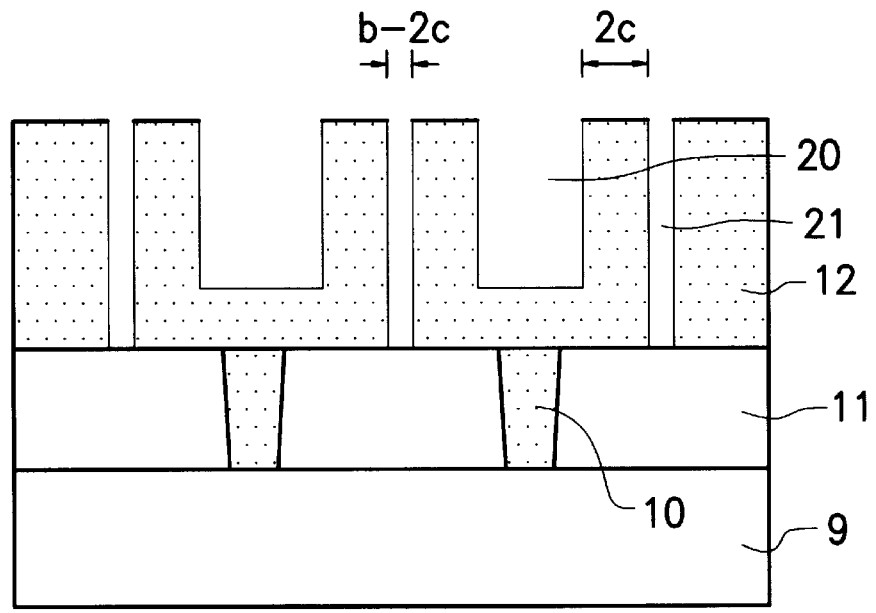

As shown in FIG. 1F, using the dielectric layers 18 as a hard etching mask and the dielectric layer 11 as an etching stop layer, the conductive layer 12 is etched to form trenches 20 and 21. The dielectric layer 18 is removed. Trench 21 is an extension of the trench 19 (FIG. 1E). Since the trench 19 already reaches a depth level of d from the top surface of the conductive layer 12, the trench 21 is able to reach the dielectric layer 11 during etching. On the other hand, insufficient etching time is provided for the trench 20 to reach the dielectric layer 11. Consequently, the conductive layer 12 between neighboring trenches 21 forms a double-recess crown-shaped structure, which is electrically connected to the substrate 9 through the conductive plug 10. In other words, depth of the trench 21 is approximately equal to the thickness of the conductive layer, while the depth of the trench 20 is less than the thickness of the conductive layer 12. Distance of separation between two neighboring double-recess crown-shaped conductive layers 12 is about b=2c. This double-recess crown-shaped conductive layer 12 is the lower electrode of a double-recess crown-shaped DRAM capacitor.

A conformal dielectric layer and a conformal conductive layer are sequentially formed over the crown-shaped conductive layer 12. The conformal conductive layer is the upper electrode of the capacitor. The conformal dielectric layer can be an oxide/nitride/oxide (ONO) composite layer and the conformal conductive layer can be a doped polysilicon layer. Both the conformal dielectric layer and the conformal conductive layer can be formed, for example, by chemical vapor deposition.

In the aforementioned embodiment of this invention, if the lower electrode is formed using doped polysilicon or amorphous silicon, hemispherical silicon grains (HSGs) can also be grown over the surface of the double-recess crown-shaped conductive layer 12. Hence, surface area of the lower electrode is increased. The hemispherical silicon grains can be selectively grown on the interior surface and exterior sidewalls of the crown-shaped lower electrode as soon as the crown-shaped lower electrode is formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a double-recess crown-shaped capacitor of a dynamic random access memory (DRAM), comprising the steps of:

providing a substrate;

forming a first dielectric layer and a conductive plug;

forming a first conductive layer over the first dielectric layer;

forming a second dielectric layer over the first conductive layer;

patterning the second dielectric layer to form a patterned third dielectric layer;

forming an organic bottom anti-reflective coating (organic BARC) over the patterned third dielectric layer and the first conductive layer;

removing the organic BARC above the patterned third dielectric layer and a portion of the patterned third dielectric layer to form a patterned fourth dielectric layer within the patterned third dielectric layer and a first trench in the first conductive layer;

removing the organic BARC;

etching to form a second trench under the first trench and a third trench in the first conductive layer using the patterned fourth dielectric layer as an etching mask, wherein the second trench exposes a portion of the first dielectric layer while the third trench is not deep enough to expose the first dielectric layer;

removing the patterned fourth dielectric layer such that the first conductive layer having the second trench and the third trench thereon forms a double-recess lower electrode;

forming a fifth dielectric layer over the exposed surface of the double-recess lower electrode; and forming a second conductive layer over the fifth dielectric layer.

2. The method of claim 1, wherein materials for forming the second dielectric layer and the first dielectric layer are the same.

3. The method of claim 1, wherein the step of forming the first and the second dielectric layers includes depositing silicon oxide by chemical vapor deposition.

4. The method of claim 1, wherein depths of the first trench and the third trench are each smaller than a thickness of the first conductive layer, while depth of the second trench and thickness of the first conductive layer are almost the same.

5. A method for forming a lower electrode of a double-recess crown-shaped capacitor, comprising the steps of:

providing a substrate;

forming a first dielectric layer and a conductive plug;

forming a first conductive layer over the first dielectric layer;

forming a second dielectric layer over the first conductive layer;

patterning the second dielectric layer to form a trapezoidal-shaped third dielectric layer;

forming an organic bottom anti-reflective coating (organic BARC) over the trapezoidal-shaped third dielectric layer and the first conductive layer;

removing the organic BARC above the trapezoidal-shaped third dielectric layer and then removing a portion of the trapezoidal-shaped third dielectric layer to form a triangular-shaped fourth dielectric layer and a first trench in the first conductive layer, using the organic BARC as a mask;

removing the organic BARC;

etching to form a second trench under the first trench and a third trench in the first conductive layer using the triangular-shaped fourth dielectric layer as an etching mask, wherein the second trench exposes a portion of the first dielectric layer while the third trench is not deep enough to expose the first dielectric layer; and removing the triangular-shaped fourth dielectric layer.

6. The method of claim 5, wherein materials for forming the second dielectric layer and the first dielectric layer are the same.

7. The method of claim 5, wherein the step of forming the first and the second dielectric layer includes depositing silicon oxide by chemical vapor deposition.

8. The method of claim 5, wherein depths of the first trench and the third trench are smaller than a thickness of the first conductive layer, while depth of the second trench and thickness of the first conductive layer are almost the same.

* * * * *